(12) United States Patent
Kim et al.

(10) Patent No.: US 10,832,773 B1
(45) Date of Patent: Nov. 10, 2020

(54) ARCHITECTURE FOR ENABLING ZERO VALUE SHIFTING

(71) Applicant: INTERNATIONAL BUSINESS MACHINES CORPORATION, Armonk, NY (US)

(72) Inventors: Seyoung Kim, White Plains, NY (US); Tayfun Gokmen, Briarcliff Manor, NY (US); Nanbo Gong, White Plains, NY (US); Wanki Kim, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/458,806

(22) Filed: Jul. 1, 2019

(51) Int. Cl.
```
G11C 11/00      (2006.01)
G11C 13/00      (2006.01)
G11C 7/06       (2006.01)
G11C 7/10       (2006.01)
```

(52) U.S. Cl.
CPC ............ *G11C 13/004* (2013.01); *G11C 7/062* (2013.01); *G11C 7/1006* (2013.01); *G11C 2013/0042* (2013.01); *G11C 2207/063* (2013.01)

(58) Field of Classification Search
CPC .............. G11C 13/004; G11C 11/5678; G11C 13/0004; G11C 13/003; G11C 2013/0054; G11C 2213/71; G11C 2213/76; G11C 2213/72; G11C 7/06; G11C 7/1006; G11C 11/54; G11C 16/0483; G11C 13/0069; G11C 2213/77; G11C 13/0033; G11C 11/16; G11C 13/0002; G11C 13/0035; G11C 13/0061; G11C 5/005; G11C 5/02; G11C 16/26; G11C 13/0007
USPC .......... 365/148, 207, 175, 189.15, 222, 226, 365/100, 158, 185.03, 185.18, 185.2, 365/185.21, 185.22, 185.24, 191, 210.1, 365/225.7
See application file for complete search history.

(56) References Cited

U.S. PATENT DOCUMENTS

| 6,502,083 | B1 | 12/2002 | Louis et al. |
| 6,956,765 | B2 | 10/2005 | Saito et al. |
| 8,712,940 | B2 | 4/2014 | Modha |

(Continued)

OTHER PUBLICATIONS

Ambrogio, "Equivalent-Accuracy Accelerated Neural-Network Training Using Analogue Memory", Nature, vol. 558, Jun. 2018, 23 pages.

(Continued)

*Primary Examiner* — Thong Q Le
(74) *Attorney, Agent, or Firm* — Tutunjian & Bitetto, P.C.; Randall Bluestone

(57) ABSTRACT

A system includes an analog memory architecture for performing differential reading. The analog memory architecture includes a weight array including first cross-point devices located at intersections of a first set of conductive column wires and a first set of conductive row wires, and a reference array operatively coupled to the weight array and including second cross-point devices located at intersections of a second set of conductive column wires and a second set of conductive row wires. The second cross-point devices include differential unipolar switching memory devices configured to enable zero-value shifting of the outputs of the first cross-point devices.

22 Claims, 4 Drawing Sheets

(56) References Cited

U.S. PATENT DOCUMENTS

| | | |
|---|---|---|
| 9,852,790 B1 | 12/2017 | Gokmen et al. |
| 2017/0109626 A1 | 4/2017 | Gokmen et al. |
| 2018/0114572 A1 | 4/2018 | Gokmen et al. |
| 2018/0165573 A1 | 6/2018 | Hsu et al. |
| 2018/0253642 A1 | 9/2018 | Gokmen et al. |
| 2019/0221263 A1* | 7/2019 | Lee .................. G06F 7/388 |

OTHER PUBLICATIONS

Gokmen, "Acceleration of Deep Neural Network Training with Resistive Cross-Point Devices: Design Considerations", Frontiers in Neuroscience, vol. 10, Article 333, Jul. 2018, 13 pages.

Haensch, "The Next Generation of Deep Learning Hardware: Analog Computing", Proceedings of the IEEE, vol. 107, No. 1, Jan. 2019, pp. 108-122.

* cited by examiner

ARCHITECTURE FOR ENABLING ZERO VALUE SHIFTING

BACKGROUND

The present invention generally relates to memory devices, and more particularly to architectures for enabling zero-value shifting.

Artificial neural networks (ANNs) are a family of statistical learning models inspired by the biological neural networks of animals and, in particular, the brain. ANNs may be used to estimate or approximate systems and cognitive functions that depend on a large number of inputs and weights of the connections which are generally unknown. ANNs are often embodied as so-called "neuromorphic" systems of interconnected processor elements that act as simulated "neurons" that exchange "messages" between each other in the form of electronic signals.

SUMMARY

In accordance with an embodiment of the present invention, a system is provided. The system includes an analog memory architecture for performing differential reading. The analog memory architecture includes a weight array including first cross-point devices located at intersections of a first set of conductive column wires and a first set of conductive row wires, and a reference array operatively coupled to the weight array and including second cross-point devices located at intersections of a second set of conductive column wires and a second set of conductive row wires. The second cross-point devices include differential unipolar switching memory devices configured to enable zero-value shifting of the outputs of the first cross-point devices.

In accordance with another embodiment of the present invention, a system is provided. The system includes an analog memory architecture for performing differential reading. The analog memory architecture includes a weight array including first cross-point devices located at intersections of a first set of conductive column wires and a first set of conductive row wires. The first cross-point devices converge at respective symmetry points. The analog memory architecture further includes a first voltage pulse generator connected to the set of conductive row wires in the weight array, a second voltage pulse generator connected to the set of conductive column wires in the weight array, an analog-to-digital converter (ADC) connected, via an integrator, to the set of conductive column wires in the weight array, and a reference array operatively coupled to the weight array and including second cross-point devices located at intersections of a second set of conductive column wires and a second set of conductive row wires. The second cross-point devices include differential unipolar switching memory devices configured to enable zero-value shifting of the outputs of the first cross-point devices.

In accordance with yet another embodiment of the present invention, a method is provided. The method includes applying voltage pulses to first cross-point devices of a weight array of an analog memory architecture for performing differential reading to achieve symmetry point convergence. The first cross-point devices are located at intersections of a first set of conductive column wires and a first set of conductive row wires. The method further includes copying conductance values for each of the first cross-point devices to a reference array of the analog memory architecture operatively coupled to the weight array. The reference array includes second cross-point devices located at intersections of a second set of conductive column wires and a second set of conductive row wires, and the second cross-point devices include differential unipolar switching memory devices. The method further includes enabling zero-value shifting of outputs of the first cross-point devices using the second cross-point devices.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
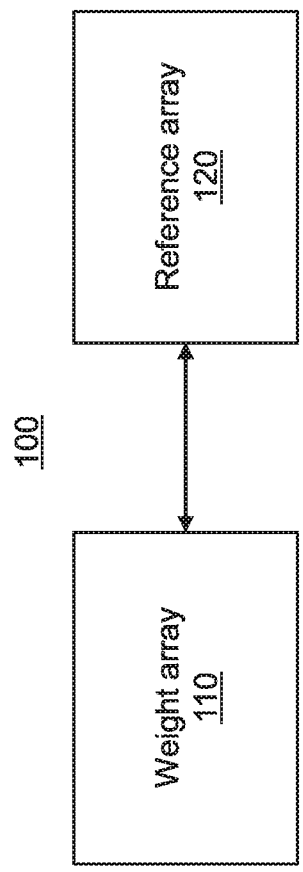
FIG. 1 is a block diagram of an overview of a memory device architecture, in accordance with an embodiment of the present invention.

The embodiments described herein provide for an architecture for implementing zero-value shifting. More specifically, the architecture can include a double differential reading architecture having a weight array of memory devices and a reference array of memory devices that can be used to store the average zero weights. For example, the embodiments described herein can be applied to a reference array including a cross-point array of differential unipolar switching memory devices, where a pair of the differential unipolar switching memory devices at a cross-point can be used to represent weight. The pair of the differential unipolar switching memory devices can be used for double differential reading to express both positive value and non-positive value weights via a subtraction operation (e.g., zero and negative value weights). Accordingly, the embodiments described herein can use a reference array based on unipolar switching memory pairs to implement zero-shifting.

The architecture can include arrays of random-access memory (RAM) devices. More specifically, the architecture can include crossbar arrays of non-volatile memory devices. For example, crossbar arrays of non-volatile memory devices of the architecture can be used to accelerate neural network training processes (e.g., backpropagation).

In one embodiment, the architecture can include, e.g., crossbar arrays of resistive RAM (ReRAM) devices. ReRAM technology can be used for electronic synapse devices, memristors for neuromorphic or analog computing, and high-density/high-speed non-volatile memory applications.

In another embodiment, the architecture can include, e.g., crossbar arrays of phase-change memory (PCM) devices. PCM can exploit semiconducting properties of phase-change materials, such as, e.g., chalcogenide glass, that include amorphous and crystalline phases. Information can be stored in the amorphous and crystalline phases, which can be reversibly switched by applying an external voltage. Information can be read by measuring a resistance of the PCM cell. PCM technology can be used for electronic synapse devices, memristors for neuromorphic or analog computing, and high-density/high-speed non-volatile memory applications.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of an architecture 100 including a double differential reading architecture having a weight array 110 and a reference array 120 of memory devices is provided.

The connections in neural networks that carry electronic messages between simulated neurons can be provided with adjustable and tunable numeric weights that correspond to the strength or weakness of a given connection, making neural networks adaptive to inputs and capable of learning. For example, a neural network for handwriting recognition can be defined by a set of input neurons which may be activated by the pixels of an input image. After being weighted and transformed by a function determined by the network's designer, the activations of these input neurons can then passed to other downstream neurons, which are often referred to as "hidden" neurons. This process is repeated until an output neuron is activated. The activated output neuron determines which character was read.

The architecture 100 can be used to implement weights within a neural network. More specifically, differences between readings of the weight array 110 and the reference array 120 can be used to achieve positive and non-positive (e.g., zero and negative) weights. In one embodiment, the architecture 100 can include a ReRAM device architecture including a one-transistor one-resistor ("1T1R") memory cell. In an alternative embodiment, the architecture 100 can include a PCM device architecture.

The architecture 100 can be an analog memory architecture including analog arrays that can be used to perform differential reading including analog array-based vector-matrix computations. As compared to digital memory architectures including digital arrays that perform, e.g., $n^2$ computations, the analog memory architecture can accelerate performance by performing parallel computations. Accordingly, the architecture 100 can achieved improved performance over, e.g., CPU and/or GPU computational arrangements.

As will be described in further detail with reference to FIGS. 2 and 3, the reference array 120 can illustratively include a cross-point array of differential unipolar switching memory devices, where a pair of the differential unipolar switching memory devices can be used to represent the weight. The pair of memory devices can be used for double differential reading to express both positive and non-positive weights (e.g., zero and negative weights). Accordingly, the embodiments described herein can use a reference array based on unipolar switching memory pairs to implement zero-shifting.

An illustrative example of the architecture 100 will now be described in further detail below with reference to FIG. 2.

Figure 2:
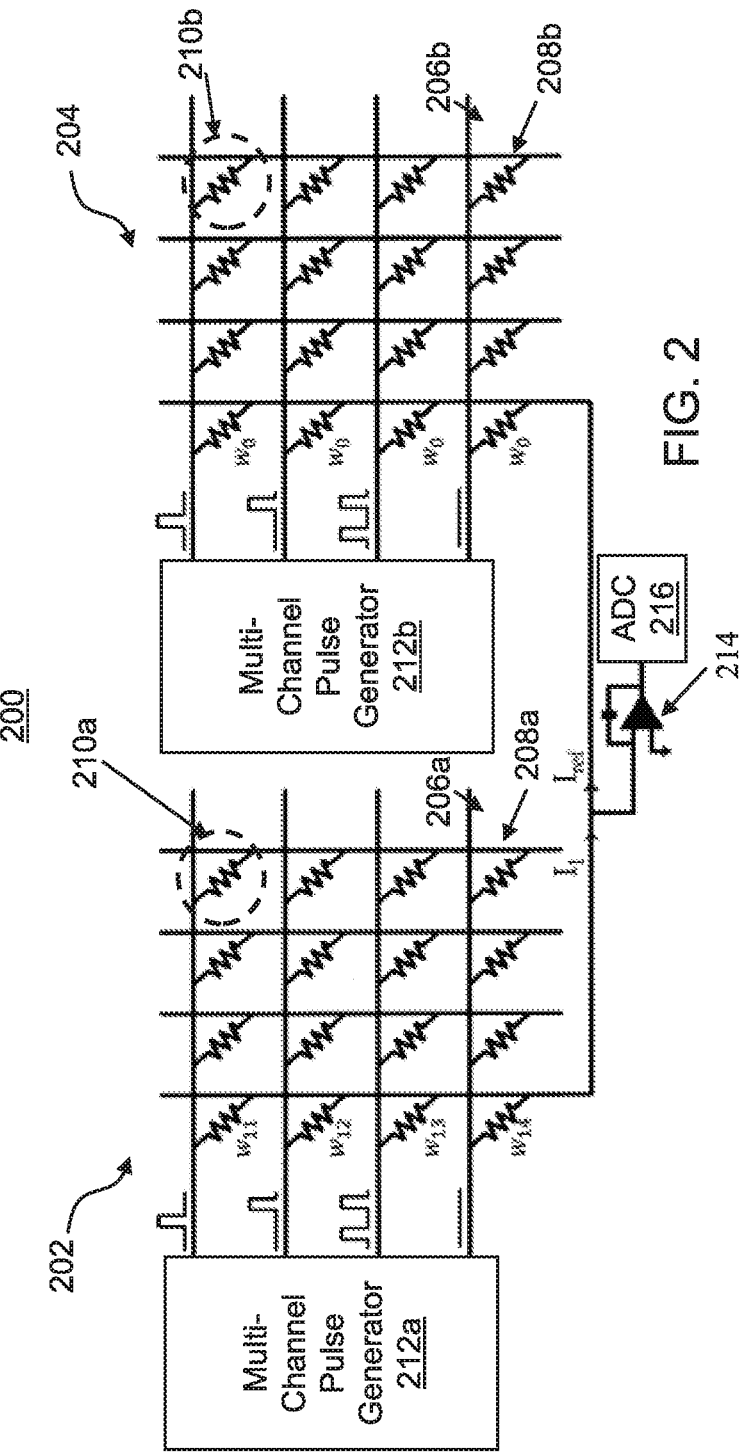
FIG. 2 is a diagram of an exemplary memory device architecture including a weight array and a reference array, in accordance with an embodiment of the present invention.

With reference to FIG. 2, a diagram is provided illustrating an architecture 200. For example, the architecture 200 can be used to implement weights within a neural network. More specifically, as will be described in further detail below, the architecture 200 can be an analog memory architecture including analog arrays that can be used to perform differential reading including analog array-based vector-matrix computations.

As shown, the architecture 200 includes a weight array 202 and a reference array 204. The arrays 202 and 204 can be interconnected. Each of the arrays 202 and 204 includes a crossbar array that includes two sets of conductive wires, where the two sets of conductive wires include a set of conductive row wires and a set of conductive column wires intersecting the set of conductive row wires. More specifically, as shown, the weight array 202 includes a row wire 206a and a column wire 208a intersecting the row wire 206a, and the reference array 204 includes a row wire 206b and a column wire 208b intersecting the row wire 206b.

As further shown, the intersections between the sets of conductive wires are separated by respective cross-point devices. In a neural network, the cross-point devices, in effect, function as weighted connections between neurons, and can enable the performance of backpropagation in parallel with a larger acceleration as compared to, e.g., CPU and/or GPU computational arrangements.

For example, the weight array 202 includes a cross-point device 210a and the reference array 204 includes a cross-point device 210b. In one embodiment, the cross-point devices include resistive cross-point devices. However, such embodiments should not be considered limiting, and any suitable devices can be used to implement the cross-point devices. As can be seen, there is a one-to-one correlation between the cross-point devices in the weight array 202 and the cross-point devices in the reference array 204, such that a unique zero-weight value can be established in each cross-point device in the reference array 204 for a corresponding one of the cross-point devices in the weight array 202 (e.g., cross-point devices 210a and 210b). During operation, the outputs of the cross-point devices in the weight array 202 can be shifted by the zero-weight value from the corresponding cross-point devices stored in the reference array 204. The weights of each of the cross-point devices can be optimized.

Practical candidates for cross-point devices in the architecture 200 such as, e.g., ReRAM devices and/or memristors, PCM devices, etc., can be non-linear when the resistance state, and therefore weight value, is updated/programmed.

For example, the architecture 200 can be an RPU architecture. Generally, an RPU can include at least a first terminal, a second terminal and an active region. A conduction state of the active region identifies a weight value of the RPU, which can be updates/adjusted by application of a signal to the terminals. For example, the RPU can be a 2-terminal RPU having the first and second terminals. As another example, the RPU can be a 3-terminal RPU having the first and second terminals, as well as a third terminals. However, the number of terminals of the RPU should not be considered limiting, and any suitable n-terminal RPU can be used in accordance with the embodiments described herein. For example, an n-terminal RPU can effectively serve as a 2-terminal device by controlling the extra terminals.

Nanoscale 2-terminal devices, such as, e.g., memristors having an "ideal" conduction state switching characteristics, can be used as the cross-point devices in order to emulate synaptic plasticity with high energy efficiency. The conduction state (e.g., resistance) of the memristor material can be altered by controlling the voltages applied between individual wires of the row and column wires. Data can be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target cross-point device.

As further shown, the weight array 202 further includes a pulse generator 212a and the reference array 204 further includes a pulse generator 212b. In one embodiment, the pulse generators 212a and 212b are multi-pulse generators. The pulse generators 212a and 212b can generate up and down voltage pulses to each row to read the weight values of the individual cross-point devices by inducing corresponding amounts of currents (e.g., $I_1$ corresponding to column 1 of the weight array 202) to the columns. The voltage pulses can be an amplitude-modulation signal, a pulse width modulation signal, etc.

The pulse generators 212a and 212b can generate what is referred to herein as a "weight matrix" of the cross-point devices having differing conductances. The output vector from this weight matrix is the current signal output from each column (e.g., I1 from column 1) that can be read using an integrator 214 coupled to an analog-to-digital converter (ADC) 216. For example, the integrator 214 can be a current integrator. The ADC 216 is connected to the set of conductive column wires in the weight array 202 via the integrator 214.

According to an exemplary embodiment, the voltage pulse generators 212a and 212b can be controlled by a computer-based apparatus, which can also process the output signals from the weight array 202 (e.g., $I_1$). As another example, instead of or in addition to computer control, an RPU block can be used. An example of a computer-based apparatus is described below with reference to FIG. 5.

Repeated up and down voltage pulses (e.g., first, second, third, . . . ) can be applied to the cross-point devices in the weight array 202 in a random and/or alternating manner via the pulse generators 212a and 212b until all of the cross-point devices in the weight array 202 converge to their own symmetry point. As used herein, the term "symmetry point" refers to a point where the slopes of the up and down pulses for each of the cross-point devices are the same (e.g., where the weight stabilizes). Once the symmetry points are found, they can be used as a metric to which the zero-point weight reading for each of the cross-point devices is matched to improve performance accuracy (e.g., neural network performance accuracy).

For instance, the first voltage pulse applied to a given cross-point device in the weight array 202 can randomly be either an up pulse or a down pulse, the second voltage pulse applied to the same cross-point device in the weight array 202 can also randomly be either an up pulse or a down pulse, etc. In another exemplary embodiment, the up and down voltage pulses are applied repeatedly to each of the cross-point devices in the weight array 202 in an alternating manner. For instance, if the first voltage pulse applied to a given cross-point device in the weight array 202 is an up pulse, then the second voltage pulse applied to the given cross-point device in the weight array 202 is a down pulse, the third voltage pulse applied to the given cross-point device in the weight array 202 would be an up pulse, and so on. The same pattern would apply if the first voltage pulse was a down pulse, i.e., down/up/down, etc.

The number of pulses needed to achieve a symmetry point can depend on the conductive range. For example, if the conductance range is from $G_{min}$ to $G_{max}$, and the average change in G at one update incident is $\Delta G_{avg}$, then the effective number of states in the conductance range can be represented by $(G_{max}-G_{min})/\Delta G_{avg}$. When a device is at the extreme points and alternating up/down pulses are applied, then it will take a number of updates to reach the center point equal to $(G_{max}\ G_{min})/\Delta G_{avg}$. To ensure the convergence, extra cycles of alternating up/down pulses can be applied. Accordingly, $n \times (G_{max}-G_{min})/\Delta G_{avg}$ can be applied to reach a symmetry point, where n is a positive integer.

When the voltage pulses are applied stepwise to adjust the weight up or down, the amount of weight update (e.g., the size of the steps) can be linearly dependent on the current weight value. For example, as up pulses are applied stepwise, the weight value can increase, but can eventually become saturated. This same saturation behavior can occur with the stepwise application of down pulses. Thus, the size of the adjustment steps (up or down) can be different depending on the current weight value, but only one symmetry point exists.

As previously mentioned, the weight array 202 and the reference array 204 can provide an analog array representation of a matrix to express weight values, which can be positive, negative and/or zero values. More specifically, the architecture 200 can be used to perform differential reading by applying identical pulses to the corresponding rows in arrays and read out the current. The differential reading can be performed by, e.g., taking the difference of $I_1$ and $I_{ref}$. The output currents can be used to achieve vector-matrix operations.

For example, once all of the cross-point devices in the weight array 202 have all converged/been programmed to their own symmetry points, the weights (e.g., conductance values) for each of the cross-point devices from the weight array 202 at the symmetry point can be copied to the reference array 204. For example, the current readings can be compared with the reference array 204 current readings to copy the weights. The weights copied to the reference array 204 define a zero-weight point when current is read-out using the pair of arrays for each corresponding device in weight array 202, which compensates for the unique imbalance properties in each of the cross-point devices in the weight array 202.

In one embodiment, the reference array 204 is not programmed during the application (e.g., during neural network training). In such a case, the reference array 204 can be initialized by copying the symmetry point values from the weight array 202. However, once the copying of the symmetry point values is complete, the reference array 204 is not programmed and only the weight array 202 is programmed during training.

Figure 3:
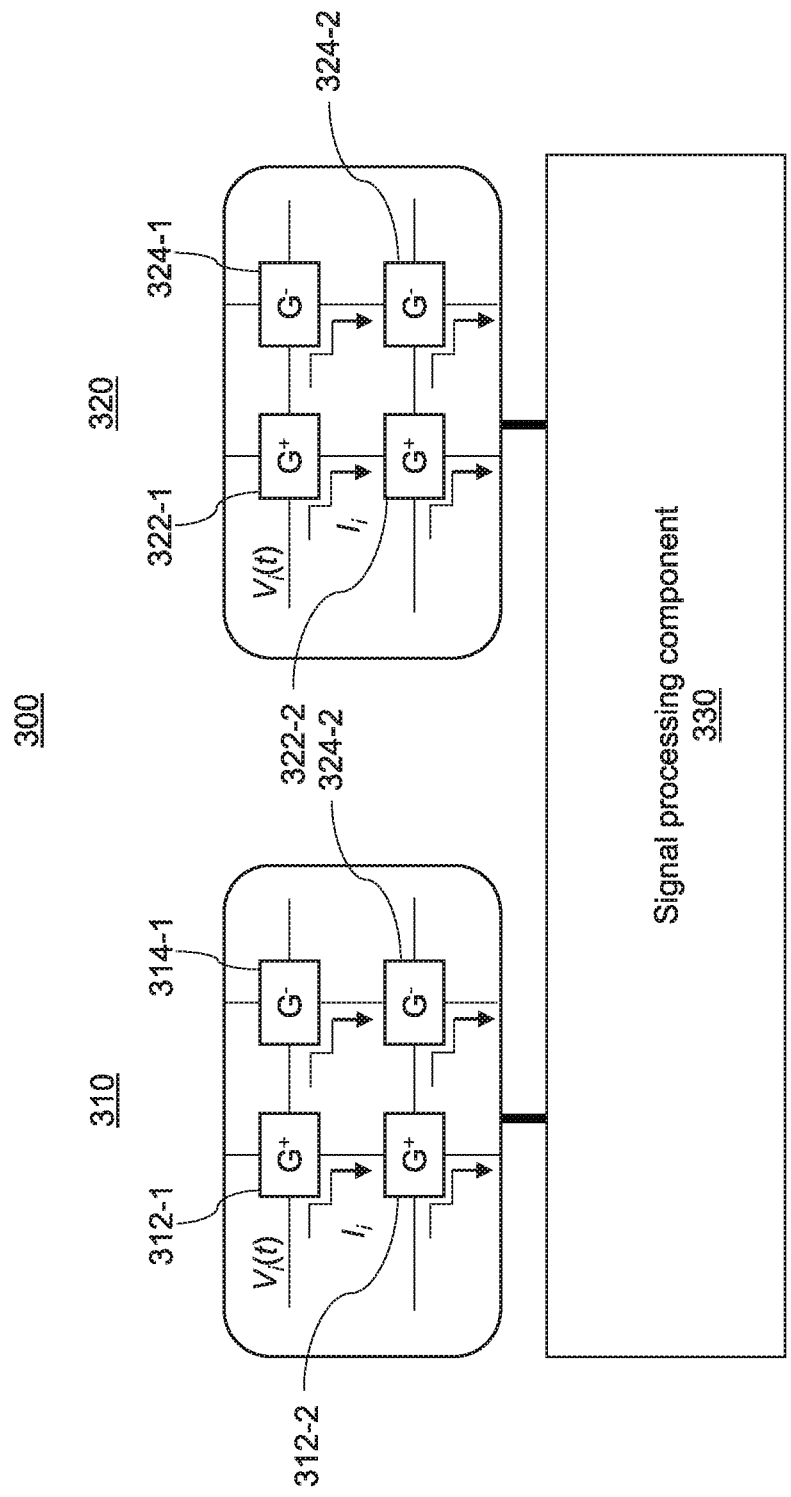
FIG. 3 is a diagram of an exemplary memory device architecture including a weight array and a reference array for enabling zero-value shifting, in accordance with an embodiment of the present invention.

With reference to FIG. 3, a diagram is provided illustrating an architecture 300. For example, the architecture 300 can be used to implement weights within a neural network. More specifically, as will be described in further detail below, the architecture 300 can be an analog memory architecture including analog arrays that can be used to perform differential reading including analog array-based vector-matrix computations.

As shown, the architecture 300 includes a first set of cross-point devices 310 corresponding to a weight array (e.g., the weight array 202 of FIG. 2) and a second set of cross-point devices 320 corresponding to a reference array (e.g., the reference array 204 of FIG. 2). The architecture 300 further includes a signal processing component 330. The signal processing component can include an integrator and ADC, such as the integrator 214 and ADC 216 described above with reference to FIG. 2. Although not shown, the architecture 300 can further include pulse generators (e.g., the pulse generators 212a and 212 of FIG. 2).

A voltage pulse at time t corresponding to a row i in an array, $V_i(t)$, can be multiplied by a weight corresponding to a position of a given cross-point in the array, $w_{ij}$, where j is a column in the array, to calculate a current, $I_j$, using Ohm's law.

Each weight $w_{ij}$ can be represented by an effective conductance $G=G^+-G^-$, where $G^+$ and $G^-$ are components of the conductance corresponding to respective ones of the memory devices of the pair for double differential reading. More specifically, first one of the two memory devices of the pair can be used for G⁺ and a second one of the two memory devices of the pair can be used for G⁻. That is, the first memory device can be considered to be a "G⁺ device" and the second memory device can be considered to be a "G⁻ device." For example, in the first set of cross-point devices 310, devices 312-1 and 312-2 each correspond to a G⁺ device, while devices 314-1 and 314-2 each correspond to a G⁻ device. In the second set of cross-point devices 320, devices 322-1 and 322-2 each correspond to a G⁺ device, while devices 324-1 and 324-2 each correspond to a G device.

In a forward inference step of a neural network, the voltage pulse $V_i(t)$ can correspond to an excitation, $x_i$, of a neuronal element of the neural network. The overall signal along the column, $I_j$, can then be determined based on each weight contribution. For example, using Kirchoff's law, $I_j = \Sigma_i x_i w_{ij}$.

The second set of cross-point devices 320 can include two-unipolar switching memory devices, where a pair of the two-unipolar switching memory devices can be used to represent the weight. The pair of memory devices can be used for double differential reading to express both positive and non-positive weights (e.g., zero and negative weights). While updating pairs of G⁺ and G⁻ devices, the zero point can vary as learning progresses. Accordingly, the embodiments described herein can use a reference array based on unipolar switching memory pairs to implement zero-shifting, and can compensate for such zero point variance by tuning the reference array, thereby improving applications of the array of memory devices (e.g., neural network performance).

Figure 4:
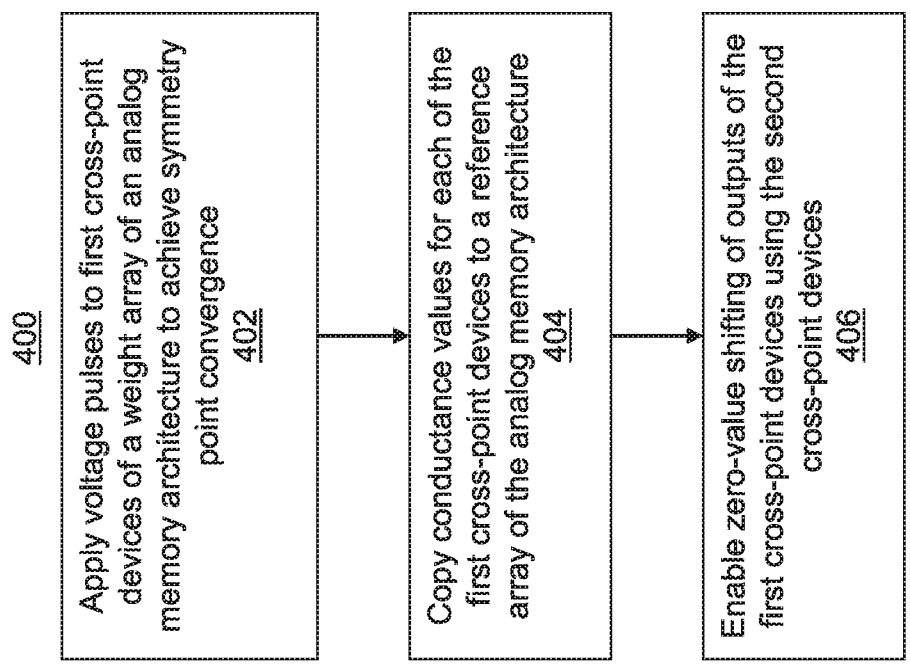
FIG. 4 is a block/flow diagram of a system/method for enabling zero-value shifting, in accordance with an embodiment of the present invention.

With reference to FIG. 4, a block/flow diagram is provided illustrating an example of a system/method 400 implementing the memory device architectures described above with reference to FIGS. 1-3. More specifically, the system/method 400 can be implemented within, e.g., a neural network.

At block 402, voltage pulses are applied to first cross-point devices of a weight array of an analog memory architecture to achieve symmetry point convergence. The first cross-point devices are located at intersections of a first set of conductive column wires and a first set of conductive row wires. The voltage pulses can include up and down voltage pulses that can be repeatedly applied by a pulse generator to increase/decrease the resistance of the cross-point devices, and can be applied by generating voltages pulses to each row to update/adjust the weight values of the individual cross-point devices. In one embodiment, the voltage pulses are applied randomly. In another embodiment, the voltage pulses are applied in an alternating manner.

After the first cross-point devices have converged to their respective symmetry points, at block 404, conductance values for each of the first cross-point devices are copied to a reference array of the analog memory architecture. The reference array is operatively coupled to the weight array, and includes second cross-point devices located at intersections of a second set of conductive column wires and a second set of conductive row wires. More specifically, the second cross-point devices can include differential unipolar switching memory devices. The conductance values copied to the reference array can include zero-weight values and set a zero-weight point in the reference array (e.g., $I_{ref}$) for each corresponding first cross-point device that compensates for the unique imbalance properties in each first cross-point device.

At block 406, zero-value shifting of outputs of the first cross-point devices is enabled using the second cross-point devices. More specifically, the outputs of the first cross-point devices are shifted by the zero-weight value from the corresponding second cross-point devices. For example, during operation, a signal can be provided to both the weight array and the reference array to obtain outputs of the weight array and outputs of the reference array. The outputs from the first cross-point devices (e.g., $I_1$, $I_2$, $I_3$, etc.) can then be zero-shifted by subtracting those values from corresponding ones of the outputs of the reference array, thereby achieving zero-shifted results.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
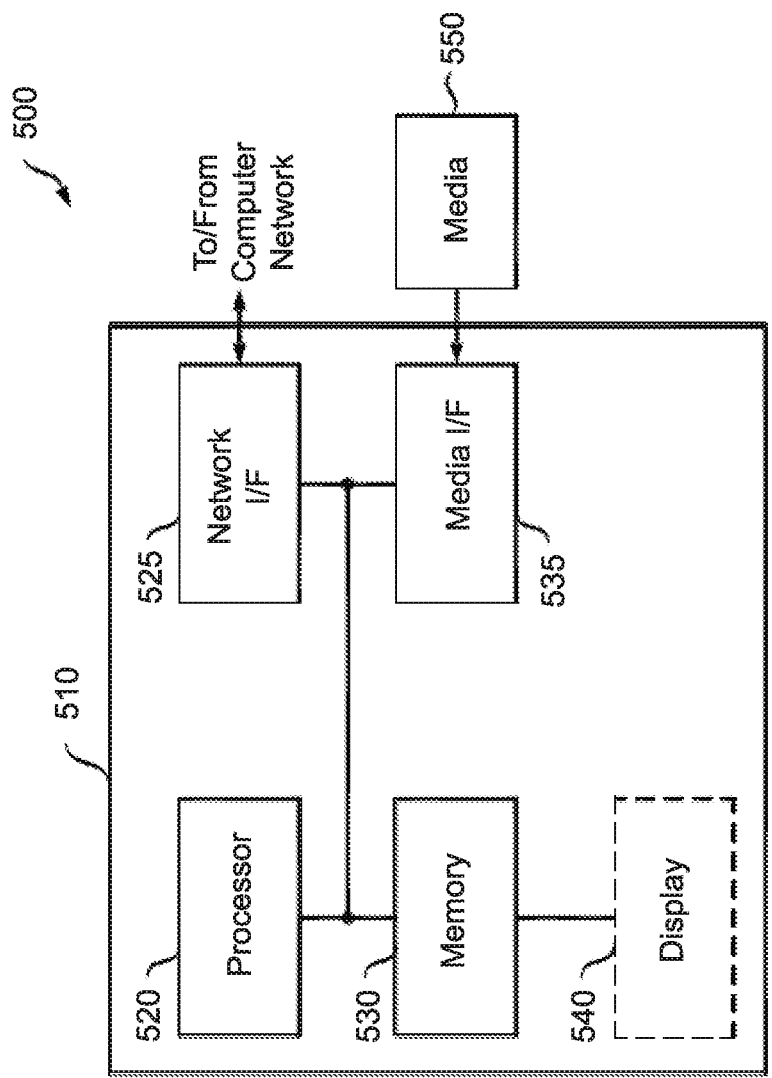
FIG. 5 is a diagram illustrating an exemplary apparatus that can be employed in carrying out one or more technique, in accordance with an embodiment of the present invention.

With reference to FIG. 5, a block diagram is provided illustrating an apparatus 500 for implementing one or more of the methodologies presented herein. By way of example only, apparatus 500 can be configured to control the voltage pulses applied to the arrays via the voltage pulse generators and/or process the output signals from the weight and reference arrays. As another example, instead of or in addition to computer control using the apparatus 500, an RPU block can be used.

Apparatus 500 includes a computer system 510 and removable media 550. Computer system 510 includes a processor device 520, a network interface 525, a memory 530, a media interface 535 and an optional display 540. Network interface 525 allows computer system 510 to connect to a network, while media interface 535 allows computer system 510 to interact with media, such as a hard drive or removable media 550.

Processor device 520 can be configured to implement the methods, steps, and functions disclosed herein. The memory 530 could be distributed or local and the processor device 520 could be distributed or singular. The memory 530 could be implemented as an electrical, magnetic or optical memory, or any combination of these or other types of storage devices. Moreover, the term "memory" should be construed broadly enough to encompass any information able to be read from, or written to, an address in the addressable space accessed by processor device 520. With this definition, information on a network, accessible through network interface 525, is still within memory 530 because the processor device 520 can retrieve the information from the network. It should be noted that each distributed processor that makes up processor device 520 generally contains its own addressable memory space. It should also be noted that some or all of computer system 410 can be incorporated into an application-specific or general-use integrated circuit.

Display 540 is any type of display suitable for interacting with a human user of apparatus 500. Generally, display 540 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

Having described preferred embodiments of memory device architectures and methods of implementing the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system comprising:
an analog memory architecture for performing differential reading, including:
a weight array including first cross-point devices located at intersections of a first set of conductive column wires and a first set of conductive row wires; and
a reference array operatively coupled to the weight array and including second cross-point devices located at intersections of a second set of conductive column wires and a second set of conductive row wires;
the second cross-point devices including differential unipolar switching memory devices configured to enable zero-value shifting of the outputs of the first cross-point devices.

2. The system of claim 1, wherein the first cross-point devices converge at respective symmetry points.

3. The system of claim 1, wherein conductance values for each of the first cross-point devices are copied to the reference array.

4. The system of claim 1, wherein the first and second cross-point devices include resistive processing units (RPUs).

5. The system of claim 1, further comprising:
a first voltage pulse generator connected to the set of conductive row wires in the weight array; and
a second voltage pulse generator connected to the set of conductive column wires in the weight array.

6. The system of claim 1, further comprising an analog-to-digital converter (ADC) connected, via an integrator, to the set of conductive column wires in the weight array.

7. The system of claim 1, wherein the analog memory architecture includes a resistive random-access memory (ReRAM) memory architecture.

8. The system of claim 1, wherein the analog memory architecture includes a phase-change memory (PCM) memory architecture.

9. A system comprising:
an analog memory architecture for performing differential reading, including:
a weight array including first cross-point devices located at intersections of a first set of conductive column wires and a first set of conductive row wires, wherein the first cross-point devices converge at respective symmetry points;
a first voltage pulse generator connected to the set of conductive row wires in the weight array;
a second voltage pulse generator connected to the set of conductive column wires in the weight array;
an analog-to-digital converter (ADC) connected, via an integrator, to the set of conductive column wires in the weight array; and
a reference array operatively coupled to the weight array and including second cross-point devices located at intersections of a second set of conductive column wires and a second set of conductive row wires;
the second cross-point devices including differential unipolar switching memory devices configured to enable zero-value shifting of the outputs of the first cross-point devices.

10. The system of claim 9, wherein conductance values for each cross-point device from the weight array are copied to the reference array.

11. The system of claim 9, wherein the cross-point devices include resistive processing units (RPUs).

12. The system of claim 9, wherein the analog memory architecture includes a resistive random-access memory (ReRAM) memory architecture.

13. The system of claim 9, wherein the analog memory architecture includes a phase-change memory (PCM) memory architecture.

14. A method comprising:
applying voltage pulses to first cross-point devices of a weight array of an analog memory architecture for performing differential reading to achieve symmetry point convergence, the first cross-point devices being located at intersections of a first set of conductive column wires and a first set of conductive row wires;
copying conductance values for each of the first cross-point devices to a reference array of the analog memory architecture operatively coupled to the weight array, the reference array including second cross-point devices located at intersections of a second set of conductive column wires and a second set of conductive row wires, wherein the second cross-point devices include differential unipolar switching memory devices; and
enabling zero-value shifting of the outputs of the first cross-point devices using the second cross-point devices.

15. The method of claim 14, wherein applying the voltage pulses includes applying up and down voltage pulses.

16. The method of claim 14, wherein the voltage pulses are applied randomly.

17. The method of claim 14, wherein the voltage pulses are applied in an alternating manner.

18. The method of claim 14, wherein the conductance values copied to the reference array include zero-weight values.

19. The method of claim 14, wherein enabling zero-value shifting of the outputs of the first cross-point devices using the second cross-point devices further includes:
applying a signal to both the weight array and the reference array to obtain the outputs of the weight array and outputs of the reference array; and
subtracting the outputs of the weight array from the outputs of the reference array.

20. The method of claim 14, wherein the cross-point devices include resistive processing units (RPUs).

21. The method of claim 14, wherein the analog memory architecture includes a resistive random-access memory (ReRAM) memory architecture.

22. The method of claim 14, wherein the analog memory architecture includes a phase-change memory (PCM) memory architecture.

* * * * *